(12) United States Patent
Val et al.

(10) Patent No.: US 6,307,261 B1
(45) Date of Patent: Oct. 23, 2001

(54) METHOD FOR THE MANUFACTURING OF A SEMICONDUCTOR DEVICE WHICH COMPRISES AT LEAST ONE CHIP AND CORRESPONDING DEVICE

(75) Inventors: Christian Val, St Remy les Chevreuse; Yves Van Campenhout, Villeneuve Saint Georges; Dominique Gilet, Anthony, all of (FR)

(73) Assignees: Thomson CSF, Paris; ELA Medical, Montrouge, both of (FR)

( * ) Notice: Subject to any disclaimer, the term of this patent is extended or adjusted under 35 U.S.C. 154(b) by 0 days.

(21) Appl. No.: 08/182,093
(22) PCT Filed: May 26, 1993
(86) PCT No.: PCT/FR93/00513
 § 371 Date: Jan. 25, 1994
 § 102(e) Date: Jan. 25, 1994
(87) PCT Pub. No.: WO93/24956
 PCT Pub. Date: Dec. 9, 1993

(30) Foreign Application Priority Data

May 27, 1992 (FR) .................................................. 92 06518

(51) Int. Cl.⁷ .................................................. H01L 23/04
(52) U.S. Cl. .......................................... 257/698; 257/690
(58) Field of Search ..................................... 257/690, 698

(56) References Cited

U.S. PATENT DOCUMENTS

| 4,667,219 | * | 5/1987 | Lee et al. ............................. 257/698 |
| 4,926,241 | * | 5/1990 | Carey .................................... 257/698 |
| 5,065,227 | * | 11/1991 | Frankeny et al. ..................... 257/698 |
| 5,475,236 | * | 12/1995 | Yoshizaki ............................. 257/690 |

FOREIGN PATENT DOCUMENTS

| 0448276 | 9/1991 | (EP) . |
| 2622741 | 5/1989 | (FR) . |
| 2092376 | 8/1982 | (GB) . |
| 810188443 | 5/1983 | (JP) . |
| 8801668 | 12/1988 | (WO) . |

* cited by examiner

Primary Examiner—Shelia V. Clark
(74) Attorney, Agent, or Firm—Oblon, Spivak, McClelland, Maier & Neustadt, P.C.

(57) ABSTRACT

The semiconductor device comprises at least one chip arranged on a support. The chip is coated with an electrically insulating and heat-stable material. This electrically insulating and heat-stable material is penetrated by electrical-connection leads connecting sites of the chip to metallized contacts, and leads are substantially perpendicular both to the said sites and to the said metallized contacts.

15 Claims, 3 Drawing Sheets

METHOD FOR THE MANUFACTURING OF A SEMICONDUCTOR DEVICE WHICH COMPRISES AT LEAST ONE CHIP AND CORRESPONDING DEVICE

BACKGROUND OF THE INVENTION

1. Field of the Invention

The invention relates to a process for the fabrication of a semiconductor device which includes at least one chip, and to the corresponding device.

2. Discussion of the Background

Known processes for manufacturing semiconductor devices may be classified into three categories:

a) individual processes commonly called "die bonding" for sequential electrical connection by the bonding of metal leads, made of gold or aluminium, between a chip and electrical connection pins.

After making the electrical connections via metal leads, the chip arranged on a support is encapsulated in a plastic, or this support is filled up in order to obtain hermeticity.

However, devices obtained by these industrially reliable processes have the drawback of occupying a large area and a volume more than ten times greater than that of the chip which the device includes;

b) processes of mass-production manufacture using a tape transfer technique ("TAB" or "tape automated bonding"), such as are extensively described in the article "TAB Implementation and Trends", by Paul HOFFMANN—Mesa Technology, Mountain View, Calif.—pages 85 to 88 of the journal "Solid State Technology" of June 1988.

The tenor of this article is deemed to be incorporated into the present description.

These processes, the productivity of which is greater than that of the individual processes, advantageously allow the chips to be tested before the final assembly, but they have the drawback of requiring a special treatment of the silicon wafers and also of occupying a large area;

c) processes for electrical connection between a chip and connection pins, by the melting of metal microballs: these processes, known by the name of "flip chip" have the drawback of requiring a special treatment of the silicon wafers, and are difficult to implement reliably when the connection support and the chip have different thermal expansion coefficients. Inspection of the corresponding bonded joints is complicated and difficult to carry out.

In addition, the corresponding manufacturing equipments are specific and not widely available; the cost of this type of equipment leads to a high cost of the semiconductor devices fabricated by this process.

SUMMARY OF THE INVENTION

The aim of the invention is to create a new fabrication method capable of being implemented by means of existing manufacturing equipments, so as to produce devices which have a minimum size, which can be easily tested and inspected visually, and which can be inserted into electronic devices where the reduction in size is paramount, like pacemakers, for example.

The object of the invention is a method for the fabrication of a semiconductor device.

According to other features of the invention:

after a step of coating with heat-stable and electrically insulating material and before a metallization step, a V-shaped groove is scribed on an electrically insulating and heat-stable material at a site of tracks for cutting off chips;

the coating with electrically insulating and heat-stable material is performed so as to define pads at the location of the metal leads.

According to other features of the invention:

metallized contacts are located at locations corresponding to projecting pads on a face of the device;

the metallized contacts include a sloping side facilitating visual inspection;

the chip forms the support of the device;

the support of the device is a multilayer circuit which includes metallizations;

the multilayer support is connected to at least one chip, and the support is coated, at least on a side facing the chip, with a thickness of electrically insulating and heat-stable material corresponding to the electrical insulation of the support, the electrically insulating and heat-stable material being penetrated by at least one metal connection lead;

the device includes at least one resistor deposited at an interface between two adjacent layers.

BRIEF DESCRIPTION OF THE DRAWINGS

The invention will be better understood by virtue of the following description, given by way of non-limiting example with regard to the appended drawings in which.

DESCRIPTION OF THE PREFERRED EMBODIMENTS

Figure 1:
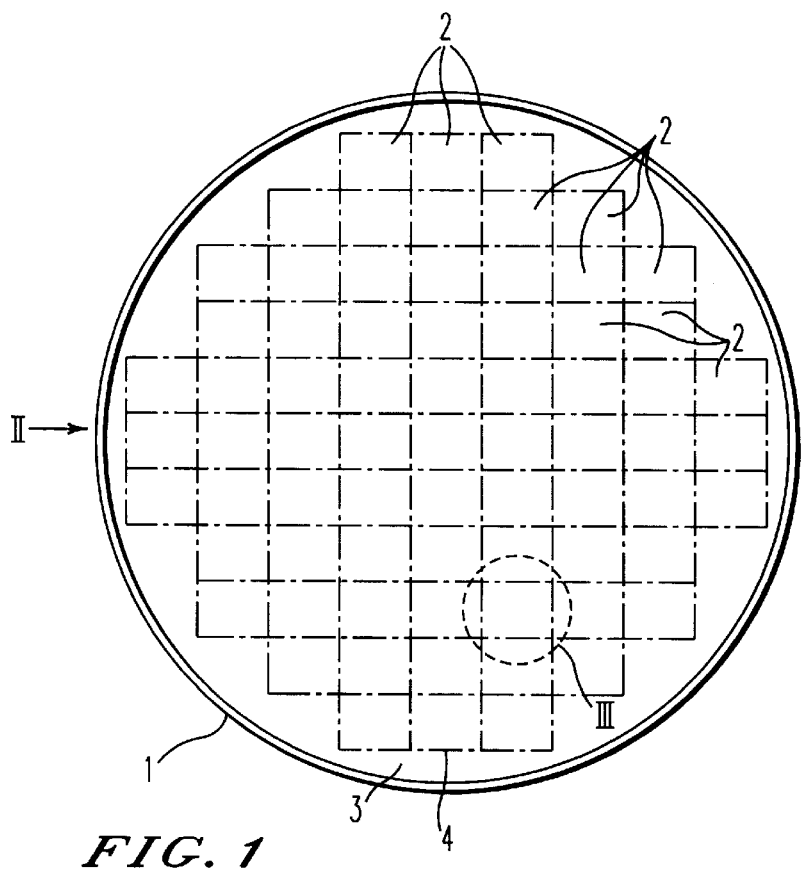
FIG. 1 represents diagrammatically a plan view of a silicon wafer or substrate according to the invention.
Figure 2:
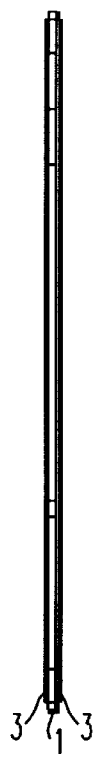
FIG. 2 represents diagrammatically a side view in the direction of the arrow II of FIG. 1 of a wafer according to the invention.
Figure 3:
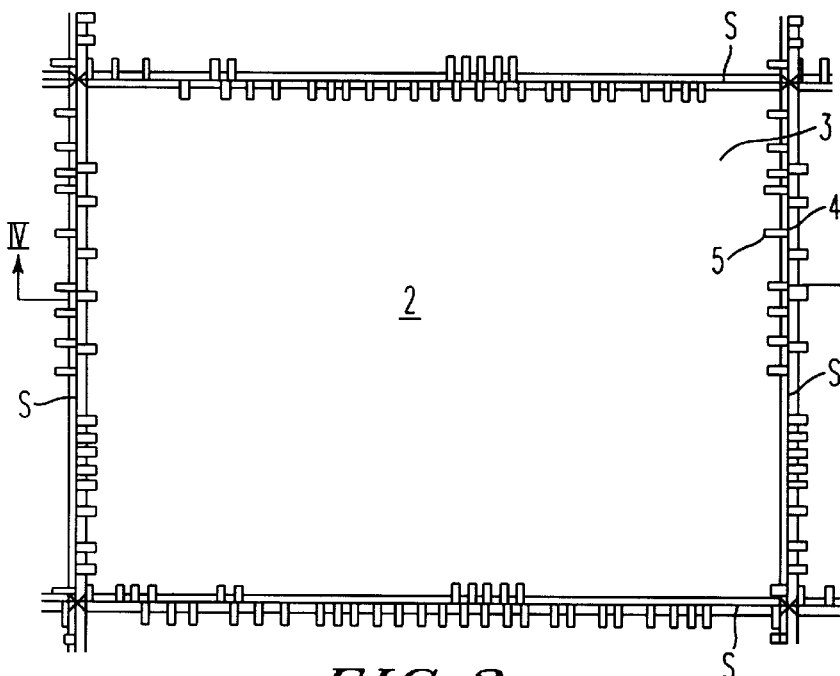
FIG. 3 represents diagrammatically an enlarged partial plan view according to the indicator III of FIG. 1.

Referring to FIGS. 1 and 2, a set of chips 2 have been produced on a substrate 1, for example a single-crystal silicon substrate, by means of known techniques of photolithography and deposition of successive layers.

An electrically insulating and preferably heat-stable material 3 has been deposited onto the substrate 1, on at least one face, with a thickness capable of ensuring the electrical insulation between the substrate and metallized contacts 4 on the surface of the heat-stable material.

The heat-stable materials which can be used for this purpose are materials having properties similar to those of polyimides, for example polyimides, polyphenylquinoxalines, polysiloxanes, epoxy resins or the like. These materials are preferably deposited by coating or an equivalent process; their thickness is then adjusted, for example by polishing or grinding to a value lying between 0.05 mm and several mm.

Preferably, when the substrate 1 has a small thickness, the heat-stable material 3 will be deposited onto both substrate faces with thicknesses (of the order of 0.5 mm, for example) sufficient to prevent buckling of the substrate and to maintain good planarity, good parallelism and a good surface finish of the outer faces.

In the example of FIGS. 3 to 6, the process according to the invention includes the following steps:

producing a set of chips 2 on a substrate 1 by known treatment operations so as to constitute connection sites 5 (of square shape, for example) on an accessible surface of the chips 2 of the substrate 1;

carrying out a sequential electrical inspection ("test") of the chips 2 produced;

carrying out a visual inspection, by means of known apparatuses, of the chips 2 produced;

making a connection to the chip 2 of ends of metal leads 6 at the site of connection squares 5 by ultrasonically melting means, and bonding by flattening the end drop 7 on a corresponding metallized square 5.

This step is similar to the hard-wiring of on-chip metal leads, known as "Bonded Interconnect Pin" (or "BIP", BIP being a registered trademark), described in the article "Next Generation Technologies" extracted from the work "High performance packaging solutions", pages 10-6 to 10-8, published in 1991 by "Integrated Circuit Engineering Corporation", ISBN 1-87 77 50-10-7. The tenor of this article is deemed to be incorporated into the present description.

getting the correct length of the metal leads 6 by cutting to a length of one or more mm, the cut leads standing up substantially perpendicularly at the sites 5 of the chips 2;

coating at least that face of the substrate 1 bearing the metal leads 6 with a heat-stable material 3 of the polyimide-resin or epoxy-resin kind;

finish-grinding at least the aforementioned face (bearing the metal leads 6) preferably by grinding or polishing to the desired thickness of resin 3, greater than 0.05 mm, so as to obtain good planarity and good parallelism of the faces;

scribing substantially V-shaped grooves 7 on the resin 3 along tracks for cutting off the chips 2, the depth of the grooves 7 preferably being less than half the thickness of finish-ground resin 3;

carrying out, in a known manner, a metallization on at least the face from which the ends of the metal leads 6 emerge, by a known process of photolithography, so as to connect the metal leads 6 to metallized electrical-connection contacts 4.

This metallization step may be carried out by the sputtering or electroplating of a metal coating containing one or more elements of the copper (Cu), nickel (Ni), gold (Au) or similar type, with a thickness preferably lying between 5 microns and 150 microns.

carrying out a test of the chips 2 by means of the metallized contacts 4;

cutting along the cutting-off tracks at the bottom of the grooves 7, so as to obtain individual chips 2.

By virtue of the method according to the invention, sloping sides 9 are obtained after metallization which are capable of being visually inspected even after fixing of the chip according to the invention on a circuit.

The sloping sides 9 forming part of the metallized contacts 4 preferably have a width comparable to the width of the flat faces 8 of the contacts 4 and are inclined with respect to these at an angle A lying between 30° and 60°, preferably on the order of 45°.

Figure 5:
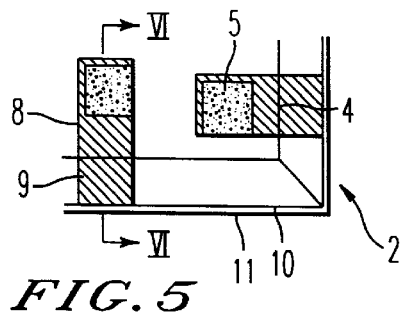
FIGS. 5 and 6 represent diagrammatically enlarged partial views respectively according to the indicators V and VI of FIG. 4.

In some applications, provision is made to protect the cut edge 10 of the chip 2 with a coating 11, represented only in FIG. 5, on insulating and chemically neutral material, of the silica type or similar insulating resin, such as preferably a polyimide capable of being deposited by photolithography (that is, "photoimageable"), or simply by dipping into a liquid-resin bath after protecting at least the face bearing the metallized contacts 4.

Figure 4:
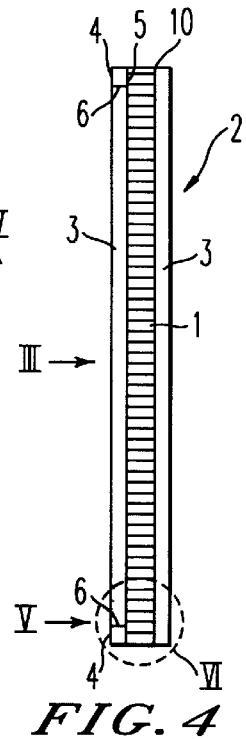
FIG. 4 represents diagrammatically a partial cross-sectional view according to the line IV—IV of the figure.
Figure 8:
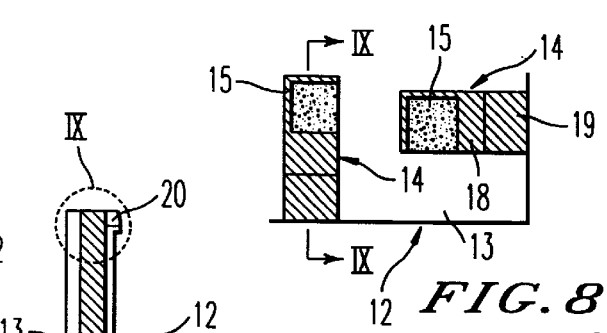
FIGS. 7, 8 and 9 represent diagrammatically views respectively similar to FIGS. 4, 5 and 6 of another embodiment of the invention.
Figure 6:
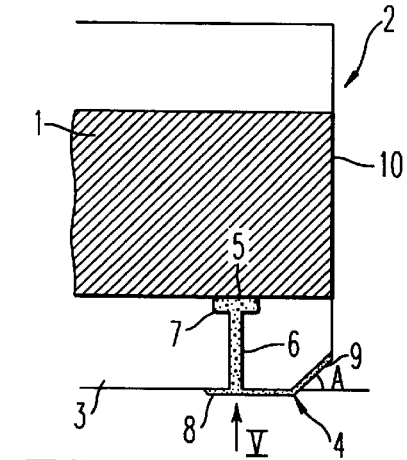
Figure 7:
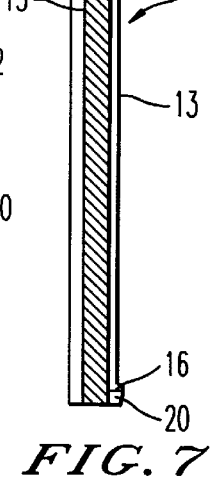
Figure 9:
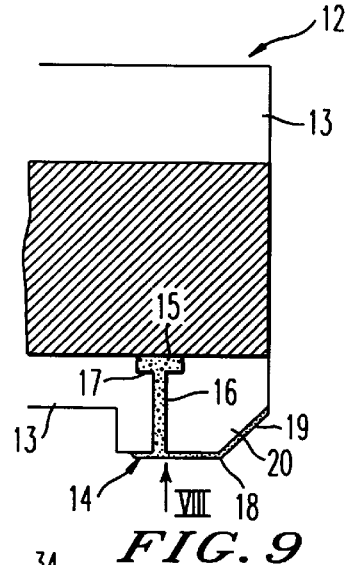

Referring to FIGS. 7 to 9, a chip is produced in a similar manner to the chip 2 of FIGS. 4 to 5 and includes coatings of material 13, contacts 14 connected at sites 15 by means of metal leads 16 terminated by flattened drops 17.

Preferably, the area of a site 15 is greater than 1600 square microns (40 $\mu$m×40 $\mu$m) and the cross-section of a lead 16 is of the order of 400 square microns.

In this second embodiment, the metallized contacts 14 are deposited over part of the flat 18 and sloping 19 outer surfaces of individual pads 20 made of resin or a similar heat-stable material. The pads 20 remain after mechanical finish-grinding or photolithographic deposition at the desired locations: these pads 20 have the advantage of allowing cleaning beneath that face of the chip 12 which is electrically connected to a circuit and is attached to a support.

Figure 10:
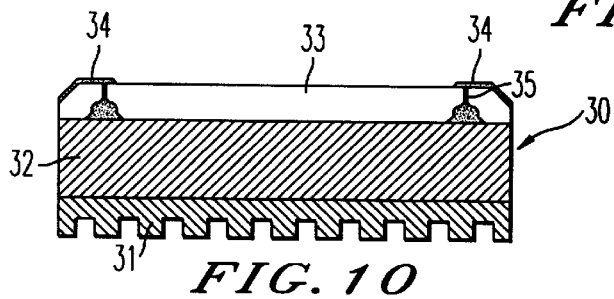
FIG. 10 represents diagrammatically a cross-sectional view similar to FIGS. 4 and 7 of a third embodiment of the invention.

Referring to FIG. 10, a device 30 includes a coating 31 forming a heat sink, for example a metal coating, fixed to an integrated circuit 32 forming a substrate and coated with a heat-stable and electrically insulating material 33.

The coating material 33 is penetrated by electrically conducting leads (made of gold or aluminium, for example) for connection to metallized electrical-connection surfaces 34: the aforementioned leads are substantially perpendicular to the metallized surfaces 34.

Figure 12:
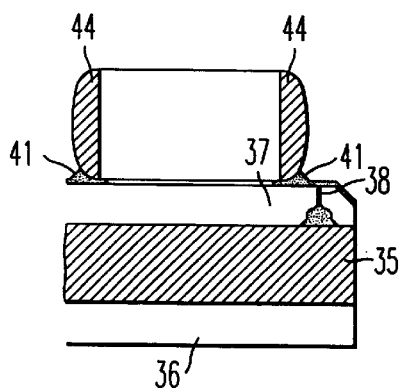
FIGS. 11 and 12 represent diagrammatically a perspective view and a partial cross-sectional section of a fourth embodiment of the invention.
Figure 11:
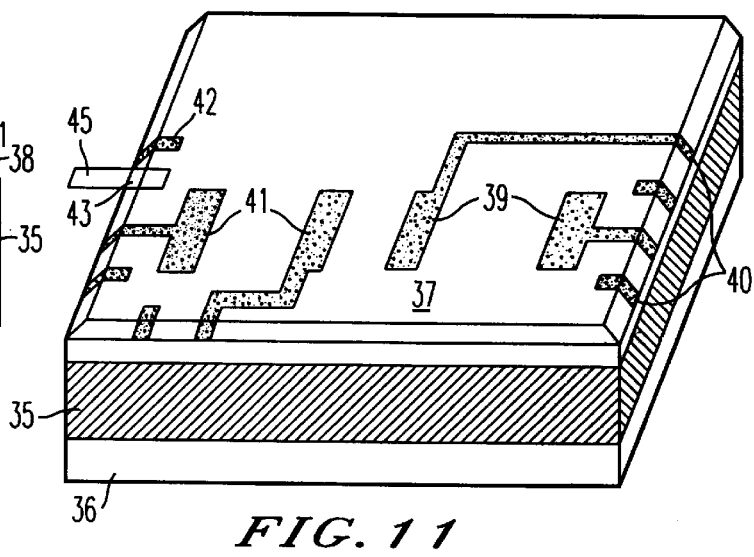

Referring to FIGS. 11 and 12, a chip 35 forming a substrate is coated on the non-active face with a material 36 of the polyimide kind.

The opposite face of the chip 35 is connected by means of electrically conducting leads 38, through a coating 37, to metallized surfaces 39, 40, 41, 42, 43. The leads 38 are substantially perpendicular both to the face of the chip 35 and to the metallized surfaces 39 to 43.

A passive component, which includes two metallized opposite ends 44, is soldered or adhesively bonded by means of an electrically conductive adhesive to the substantially retangular surfaces 41.

A connection pin 45, preferably a metal pin, is attached to the metallized surface 43 in a similar manner.

Figure 13A:
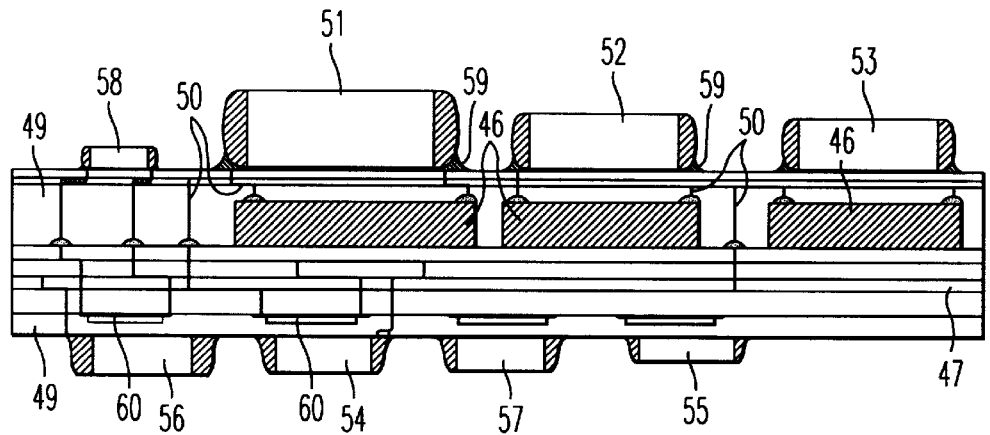
FIGS. 13A and 13B represent diagrammatically, in cross-section, two other alternative embodiments of the invention.
Figure 13B:
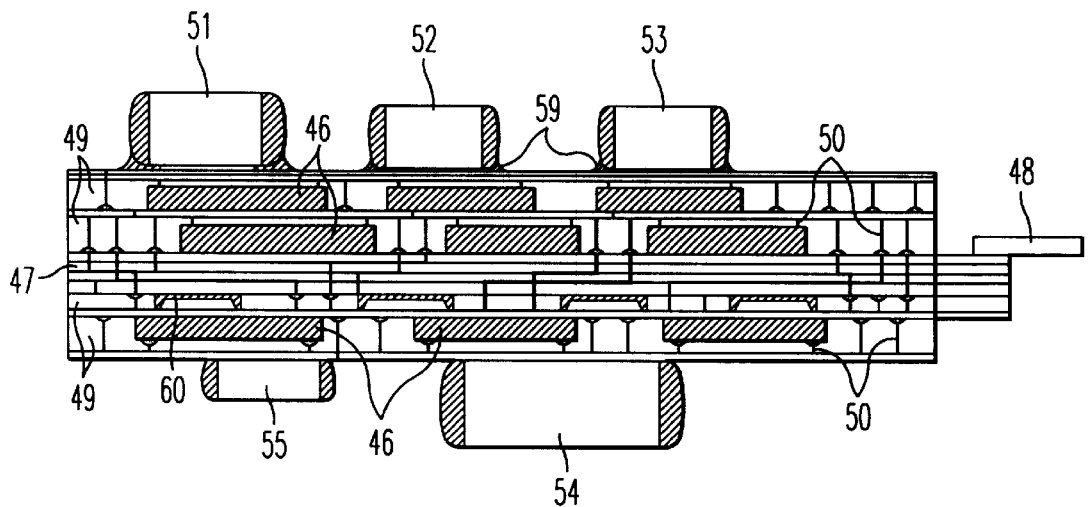

Referring to FIGS. 13A and 13B, multiple-layer devices, which include chips 46 attached to at least one multilayer support 47, are produced on a single face (FIG. 13A) or on both faces (FIG. 13B).

The multilayer support 47 is a support of known type, for example made of silicon (Si), ceramic (thin films having an alumina ($Al_2O_3$) percentage content lying between 96 and 99.5%), silicon carbide, aluminium nitride, co-fired high-temperature ceramic, co-fired low-temperature ceramic, glass or 55%-alumina glassy ceramic.

This support 47, possibly connected to connection pins 48, is coated on at least one face with a heat-stable material 49.

The heat-stable material 49 is penetrated by metal leads 50 (made of gold or aluminium, for example) for connection to other chips 46 and/or surface-mounted components 51, 52, 53, 54, 55, 56, 57, 58.

The electronic components 51 to 58 are active or passive components which preferably include metallized ends capable of being electrically connected to the metallized surfaces 59 of the outer faces.

Advantageously, provision is made to deposit resistors 60 of known type (for example screen-printed or electroplated resistors) onto the multilayer support or between two layers, which ensures maximum compactness of the devices according to the invention and a section corresponding to the section of the support 47.

What is claimed is:

1. A semiconductor device comprising:
   at least one chip having at least one connecting site;
   a first electrically insulating material directly coating a surface of the at least one chip;
   at least one electrical connection lead penetrating the first electrically insulating material to contact the at least one connecting site of the at least one chip and to connect the at least one connecting site of the at least one chip to a metallized contact formed on an outside surface of said first electrically insulating material, wherein the at least one electrical connection lead is substantially perpendicular to both the at least one connection site of the at least one chip and the metallized contact; and
   wherein the metallized contact includes a sloping side for facilitating visual inspection.

2. The semiconductor device according to claim 1, wherein the first electrically insulating material is heat-stable.

3. The semiconductor device according to claim 1, wherein the metallized contact is located at a location corresponding to a projecting pad.

4. The semiconductor device according to claim 1, further comprising a multilayer circuit including metallizations, wherein the multilayer circuit is connected to the at least one chip and is coated on at least one side facing the at least one chip with a second electrically insulating material which is penetrated by at least one metal connection lead.

5. The semiconductor device according to claim 1, wherein the at least one chip forms a first support for the semiconductor device.

6. The semiconductor device according to claim 5, further comprising a second support constituted by a multilayer circuit which includes metallizations.

7. A semiconductor device having at least one chip including at least one connecting site, comprising:
   a first electrically insulating means directly coating a surface of the at least one chip;
   at least one electrical connection means penetrating the first electrically insulating means to contact the at least one connecting site of the at least one chip and to connect the at least one connecting site of the at least one chip to a metallized contact means formed on an outside surface of said first electrically insulating means, wherein the at least one electrical connection lead is substantially perpendicular to both the at least one connection site of the at least one chip and the metallized contact means.

8. The semiconductor device according to claim 7, wherein the first electrically insulating means is a heat-stable material.

9. The semiconductor device according to claim 7, wherein the first electrically insulating means is a heat-stable material.

10. The semiconductor device according to claim 7, wherein the metallized contact means includes a sloping side for facilitating visual inspection.

11. The semiconductor device according to claim 7, further comprising a multilayer circuit means including metallizations, wherein the multilayer circuit means is connected to at least one chip and is coated on at least one side facing the at least one chip with a second electrically insulating means which is penetrated by at least one metal connection lead.

12. The semiconductor device according to claim 7, wherein the at least one chip forms a first support means for the semiconductor device.

13. The semiconductor device according to claim 12, further comprising a second support means constituted by a multilayer circuit which includes metallizations.

14. The semiconductor device according to claim 4, wherein the multilayer circuit further includes a resistor formed between two adjacent layers of the multilayer circuit.

15. The semiconductor device according to claim 7, wherein the multilayer circuit includes a resistor formed between two adjacent layers of the multilayer circuit.

* * * * *